United States Patent
Hirohata (10) Patent No.: US 9,553,256 B2
(45) Date of Patent: Jan. 24, 2017

(54) SPIN VALVE ELEMENT

(71) Applicants: Japan Science and Technology Agency, Kawaguchi-shi, Saitama (JP); The University of York, Heslington, York (GB)

(72) Inventor: Atsufumi Hirohata, Heslington (GB)

(73) Assignees: Japan Science and Technology Agency, Kawaguchi-shi, Saitama (JP); The University of York, York (GB)

( * ) Notice: Subject to any disclaimer, the term of this patent is extended or adjusted under 35 U.S.C. 154(b) by 0 days.

(21) Appl. No.: 14/439,926

(22) PCT Filed: Oct. 31, 2013

(86) PCT No.: PCT/JP2013/079599
§ 371 (c)(1),
(2) Date: Apr. 30, 2015

(87) PCT Pub. No.: WO2014/073452
PCT Pub. Date: May 15, 2014

(65) Prior Publication Data
US 2015/0311428 A1 Oct. 29, 2015

(30) Foreign Application Priority Data
Nov. 8, 2012 (JP) .................. 2012-246581

(51) Int. Cl.
*H01L 43/02* (2006.01)
*H01L 29/68* (2006.01)
(Continued)

(52) U.S. Cl.
CPC ........... *H01L 43/02* (2013.01); *H01L 29/0657* (2013.01); *H01L 29/10* (2013.01);
(Continued)

(58) Field of Classification Search
CPC .... H01L 29/68; H01L 29/82; H01L 26/66984; H01L 43/02
See application file for complete search history.

(56) References Cited

U.S. PATENT DOCUMENTS 7,626,844 B1 * 12/2009 Moriya ................ G11C 11/14
365/158
2009/0059659 A1 3/2009 Inokuchi et al.
(Continued)

FOREIGN PATENT DOCUMENTS

EP 2 190 022 A1 5/2010
JP 2003-092412 A 3/2003
(Continued)

OTHER PUBLICATIONS

Costache et al., "Experimental Spin Ratchet", Science, vol. 330, Dec. 17, 2010, pp. 1645-1648.*
(Continued)

*Primary Examiner* — Dale E Page
*Assistant Examiner* — Vincent Wall
(74) *Attorney, Agent, or Firm* — Amster, Rothstein & Ebenstein, LLP (57) ABSTRACT

A spin valve element 10 including a spin injector 12 made of a ferromagnetic material, a spin detector 16 made of a ferromagnetic material, and a channel part 14 made of a non-magnetic material. The spin detector 16 is arranged at a position separated from the spin injector 12, the channel part 14 is connected with the spin injector 12 and the spin detector 16 directly or through an insulating layer, and a plurality of spin diffusion portions 30 to 34 with enlarged cross section areas in a direction perpendicular to a spin current is formed in the channel part 14.

10 Claims, 10 Drawing Sheets (51) Int. Cl.
   *H01L 29/82* (2006.01)
   *H01L 29/66* (2006.01)
   *H01L 29/06* (2006.01)
   *H01L 29/10* (2006.01)

(52) U.S. Cl.
   CPC ........ *H01L 29/66984* (2013.01); *H01L 29/68* (2013.01); *H01L 29/82* (2013.01)

(56) References Cited

U.S. PATENT DOCUMENTS

| | | | |
|---|---|---|---|
| 2010/0027330 A1* | 2/2010 | Koo ........................ | G11C 11/18 365/170 |
| 2012/0074510 A1 | 3/2012 | Sasaki et al. | |
| 2012/0211848 A1* | 8/2012 | Sasaki .................... | H01L 43/08 257/422 |
| 2013/0044787 A1* | 2/2013 | Kirihara ................. | G01J 5/025 374/163 |
| 2013/0200446 A1* | 8/2013 | Wunderlich ............ | H01L 29/82 257/295 |

FOREIGN PATENT DOCUMENTS

| | | |
|---|---|---|
| JP | 2009-158554 A | 7/2009 |
| JP | 2010-113788 A | 5/2010 |
| JP | 2012-049403 A | 3/2012 |
| JP | 2012-069218 A | 4/2012 |
| JP | 2012-128899 A | 7/2012 |
| JP | 2012-151307 A | 8/2012 |
| JP | 2012-174323 A | 9/2012 |
| TW | 200405339 B | 4/2004 |
| TW | 200629272 B | 8/2006 |
| WO | 2010/020440 A1 | 2/2010 |
| WO | 2011/118374 A1 | 9/2011 |
| WO | 2012026168 A1 | 3/2012 |

OTHER PUBLICATIONS

Kimura et al., "Spin-polarized current induced in a single ferromagnetic strip due to inhomogeneous spin injection", Journal of Applied Physics 97, 076102 (2005), pp. 1-3.*
International Search Report received for PCT Patent Application No. PCT/JP2013/079599 mailed on Jan. 14, 2014, 2 pages (1 page of English Translation and 1 page of International Search Report).
Taiwan Patent Office, Office Action and Search Report, issued in TW Patent Application No. 102140496, which is a Taiwan counterpart of U.S. Appl. No. 14/439,926 issued on Nov. 26, 2015, 4 pages (3 pages of Office Action and 1 page of Search Report).
European Patent Office, "Extended European Search Report," issued in European Patent Application No. 13 853 186.8, which is a European Counterpart of U.S. Appl. No. 14/439,926, with an issuance date of Jul. 5, 2016, 8 pages.

* cited by examiner

SPIN VALVE ELEMENT

This application is a National Stage entry under 35 U.S.C. 371 of International Patent Application No. PCT/JP2013/079599, filed on Oct. 31, 2013, which claims the benefit of and priority to Japanese Patent Application No. 2012-246581, filed on Nov. 8, 2012, the entire contents of each of which are incorporated by reference herein.

TECHNICAL FIELD

The present invention relates to a spin valve element.

BACKGROUND ART

Conventionally, in the field of spin electronics, spin valve elements using a spin state of electrons are used (for example, see Patent Literature 1). The spin valve elements include a spin injector and a spin detector made of a ferromagnetic material, and a channel part made of a non-magnetic material, which bridges the spin injector and the spin detector. The spin valve elements generate a spin current without accompanying a flow of charges in the channel part between the spin injector and the spin detector by a so-called non-local technique, and detect a spin accumulation voltage generated in an interface between the spin detector and the channel part. Further, it is known that, in the spin valve elements, the spin current, that is, the flow of angular momentum of electrons exponentially attenuates depending on the distance from the spin injector, and the diffusion length of the spin (for example, see Patent Literature 2).

CITATION LIST

Patent Literature

Patent Literature 1: Japanese Patent Application Laid-Open No. 2012-151307
Patent Literature 2: Japanese Patent Application Laid-Open No. 2009-158554

SUMMARY OF INVENTION

Technical Problem

To design the spin valve element, it is necessary to set the length between the spin injector and the spin detector in consideration of the attenuation of the spin current. That is, there is a certain restriction that the length between the spin injector and the spin detector should be a length with which the spin current after the attenuation is detectable. Therefore, there is a limitation on the degree of freedom of arrangement of the spin injector and the spin detector, and a machining technique that satisfies the above restriction is required. Therefore, in this technical field, a spin valve element that can suppress the attenuation of the spin current is desired.

Solution to Problem

A spin valve element according to one aspect of the present invention includes: a spin injector made of a ferromagnetic material; a spin detector made of a ferromagnetic material; and a channel part made of a non-magnetic material, wherein the spin detector is arranged at a position separated from the spin injector, and the channel part is connected with the spin injector and the spin detector directly or through an insulating layer, and a spin diffusion portion with an enlarged cross section area in a direction perpendicular to a spin current is formed in the channel part.

With such a configuration, when a current or a voltage is applied to the spin injector made of a ferromagnetic material and the channel part made of a non-magnetic material, a spin current is caused in the channel part toward the spin detector. Since a spin diffusion portion with an enlarged cross section area in a direction perpendicular to the spin current is formed in a part of the channel part, the spin current caused in the channel part is diffused in the spin diffusion portion in the direction perpendicular to the spin current. In this way, diffusion of the spin current can be controlled according to the shape of the spin diffusion portion, and thus, for example, the shape of the spin diffusion portion can be formed such that the spin current from the spin injector toward the spin detector more easily flows than the spin current from the spin detector toward the spin injector. That is, the attenuation of the spin current in a desired direction can be suppressed by control of the shape of the spin diffusion portion. Accordingly, the attenuation of the spin current can be suppressed, and thus the space between the spin injector and the spin detector can be enlarged, whereby the degree of freedom of design is improved.

In an embodiment, the spin diffusion portion may be formed such that spin resistance of a path in a first direction from the spin injector toward the spin detector becomes smaller than spin resistance of a path in a second direction from the spin detector toward the spin injector.

With such a configuration, the spin resistance of the path in the first direction becomes smaller than the spin resistance of the path in the second direction, and thus there is a difference caused between diffusion of the spin current flowing into the first direction and diffusion of the spin current flowing into the second direction in the channel part. Therefore, for example, the attenuation of the spin current in the first direction can be suppressed.

In an embodiment, the spin diffusion portion has tip end portions at which the cross section area is maximized, and a rate of change of the cross section area of the spin diffusion portion in the direction perpendicular to a spin current may be larger in a case from the spin injector side toward the tip end portion than a case from the tip end portion toward the spin detector side.

With such a configuration, the degree of diffusion of the spin current flowing from the spin injector side to the tip end portions at which the cross section area of the diffusion portion is maximized and the degree of diffusion of the spin current flowing from the tip end portions to the spin detector side do not become the same, and the spin current from the spin injector toward the spin detector can be caused to more easily flow. Therefore, the attenuation of the spin current can be suppressed.

In an embodiment, the spin injector, the spin detector, and the channel part are formed on a substrate, and the spin injector and the spin detector may be arranged being separated from each other in a direction parallel to a principal plane of the substrate. In this way, the attenuation of the spin current can be suppressed in the so-called in-plane spin valve structure.

In an embodiment, the spin diffusion portion may be formed asymmetrically with respect to a line passing through the tip end portions at which the cross section area is maximized and extending in the direction perpendicular to a spin current, as viewed from the top surface of the substrate. The spin diffusion portion is made asymmetrical with respect to the line passing through the tip end portions in this way, whereby the degree of diffusion of the spin current flowing from the spin injector to the spin detector and the degree of diffusion of the spin current flowing from the spin detector to the spin injector do not become the same, and for example, the spin current from the spin injector toward the spin detector can be caused to more easily flow. Therefore, the attenuation of the spin current can be suppressed.

In an embodiment, the spin diffusion portion may be formed symmetrically with respect to an axis of the channel part, as viewed from a top surface of the substrate. The spin current is caused along an axial direction of the channel part. With such a configuration, propagation of the spin current becomes symmetrical with respect to the axial direction. Therefore, the spin current can be caused to more easily flow in the axial direction.

In an embodiment, a plurality of spin diffusion portions may be formed in the channel part. With such a configuration, the spin can be more efficiently diffused.

In an embodiment, a voltage may be detected using a non-local technique. With such a configuration, easiness of flow of spin polarization electrons without accompanying flow of charges can be controlled.

Advantageous Effects of Invention

As described above, according to one aspect and embodiments of the present invention, a spin valve element capable of suppressing attenuation of a spin current can be provided.

BRIEF DESCRIPTION OF DRAWINGS

FIGS. 6($a$) to 6($e$) are schematic diagrams illustrating a simulation result of propagation of a spin current.

FIGS. 7($a$) to 7($e$) are schematic diagrams illustrating a simulation result of propagation of a spin current.

DESCRIPTION OF EMBODIMENTS

Hereinafter, embodiments of the present invention will be specifically described with reference to the appended drawings. Note that the same elements are denoted with the same reference sign in the description of the drawings, and overlapping description is omitted. Further, dimension ratios of the drawings do not necessarily accord with the description.

Figure 1:
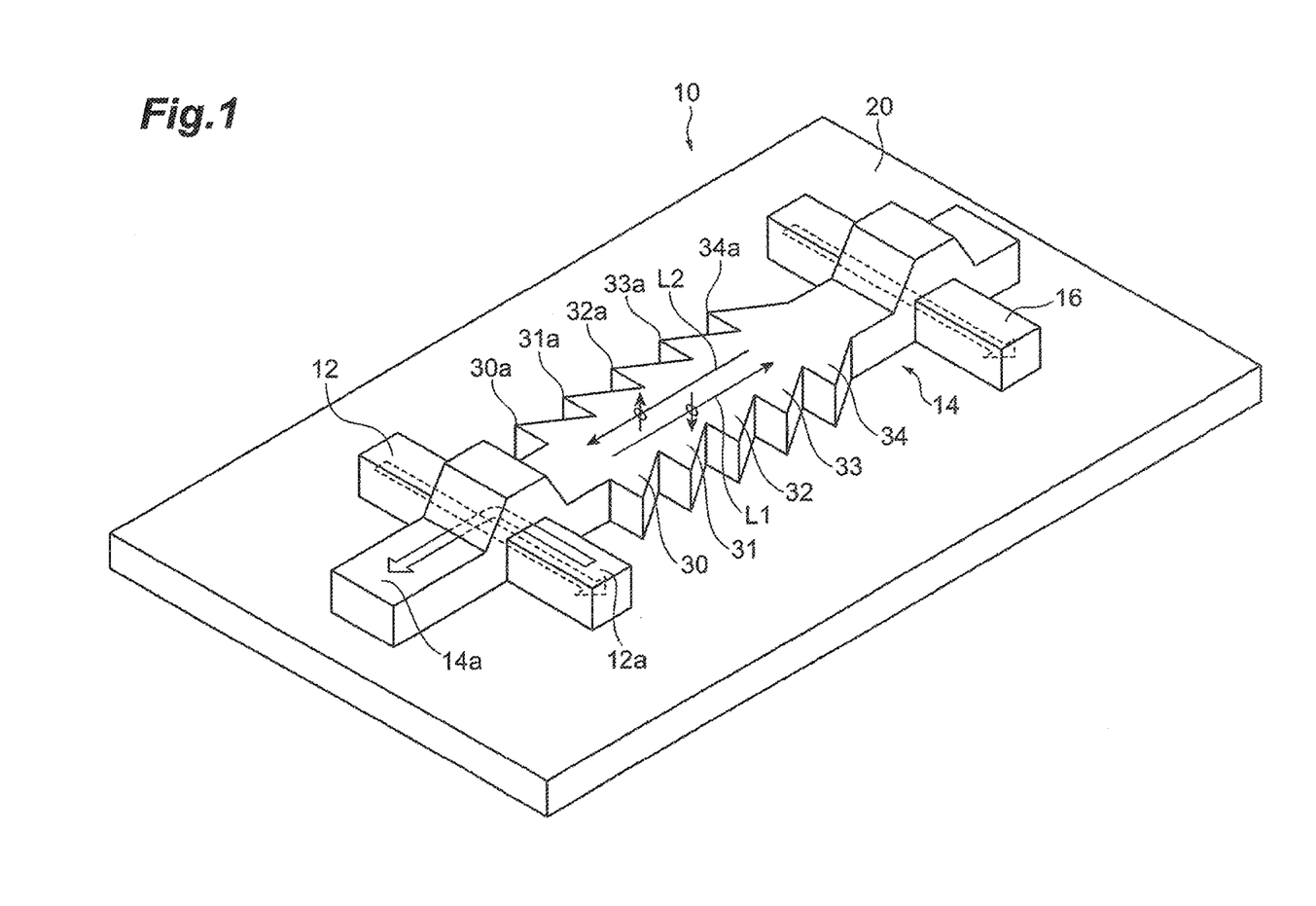
FIG. 1 is a perspective view of a spin valve element according to an embodiment of the present invention.
Figure 2:
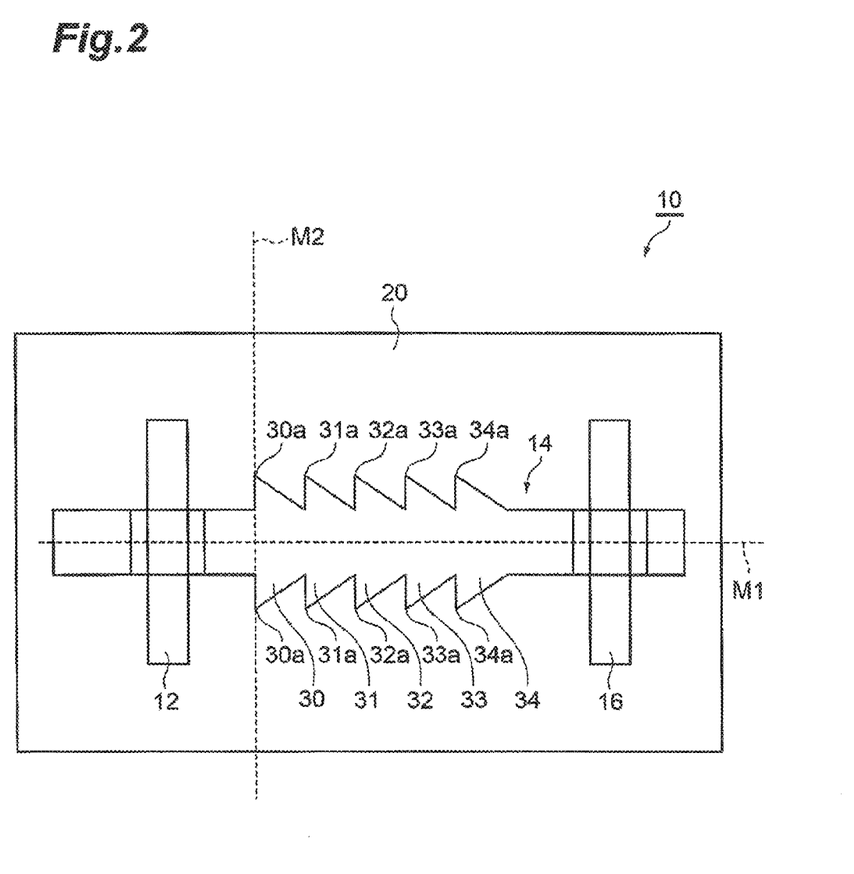
FIG. 2 is a top view of a spin valve element according to an embodiment.

A spin valve element according to an embodiment is favorably employed as an element including a so-called in-plane spin valve. FIG. 1 is a perspective view of a spin valve element 10 according to an embodiment. FIG. 2 is a top view of the spin valve element 10 according to the present embodiment.

As illustrated in FIGS. 1 and 2, the spin valve element 10 includes a spin injector 12, a channel part 14, and a spin detector 16 formed on a substrate 20. As the substrate 20, a semiconductor such as a Si, GaAs, or MgO substrate, or an insulator substrate is used. The spin injector 12, the channel part 14, and the spin detector 16 form an in-plane spin valve structure in which the channel part 14 is connected with the spin injector 12 and the spin detector 16 so as to bridge the spin injector 12 and the spin detector 16.

The spin injector 12 is a terminal that injects the spin into the channel part 14, and is a linear member, for example. The spin injector 12 is arranged on the substrate 20 such that an axial direction of the substrate 20 accords with an in-plane direction (a direction parallel to a substrate surface). The spin injector 12 is formed of a ferromagnetic material magnetized in a predetermined direction, and is formed of Fe, NiFe, or the like, for example. The arrow with a broken line in the spin injector 12 illustrated in FIG. 1 indicates the magnetization direction of the spin injector 12. The line width of the spin injector 12 is 10 μm or less, for example. Further, the line width of the spin injector 12 may be 0.1 μm or more, for example. The spin injector 12 and the channel part 14 are in contact with each other (directly bonded). A terminal portion 12$a$ for current or voltage application may be formed at one end portion of the spin injector 12. Note that the spin injector 12 may be arranged on the channel part 14. Further, the spin injector 12 and the channel part 14 may be bonded through an insulating layer.

The spin detector 16 is a terminal that detects the spin from the channel part 14, and is a linear member, for example. The spin detector 16 is arranged on the substrate 20 in a direction parallel to the principal plane of the substrate 20, being separated from the spin injector 12. The spin detector 16 is arranged on the substrate 20 such that an axial direction of the spin detector 16 accords with the in-plane direction. The spin detector 16 is made of a ferromagnetic material magnetized in a predetermined direction, and is formed of Fe, NiFe, or the like, for example. The magnetization direction is parallel to or not parallel to the magnetization direction of the spin injector 12. The arrow with a broken line in the spin detector 16 illustrated in FIG. 1 indicates the magnetization direction of the spin detector 16, and indicates the magnetization direction parallel to the magnetization direction of the spin injector 12, for example. The line width of the spin detector 16 is 10 μm or less, for example. Further, the line width of the spin detector 16 may be 0.1 μm or more, for example. The spin detector 16 and the channel part 14 are in contact with each other (directly bonded). Note that the spin detector 16 may be arranged on the channel part 14. Further, the spin detector 16 and the channel part 14 may be bonded through an insulating layer.

The channel part 14 is a linear member, and is arranged such that a direction of an axis L1 of the channel part 14 accords with the in-plane direction. The channel part 14 is connected with the spin injector 12 and the spin detector 16 directly or through an insulating layer. Bonding positions of the spin injector 12 and the spin detector 16 are positions separated from both end portions of the channel part 14. The channel part 14 is made of a non-magnetic material, and is formed of a semiconductor material such as Si or gallium arsenide (GaAs), or a non-magnetic metal such as Ag or Cu.

A terminal portion 14a for current or voltage application is formed at one end portion (an end portion closer to the spin injector 12, of both end portions) of the channel part 14. The channel part 14 may be formed such that a semiconductor layer laminated on the substrate 20 is machined in a mesa manner. The line width of the channel part 14 is 10 µm or less, for example. Further, the line width of the channel part 14 may be 0.1 µm or more, for example.

A spin diffusion portion for controlling the spin current generated in the channel part 14 is formed in a part of the channel part 14. Here, five spin diffusion portions 30 to 34 are formed in the channel part 14, as an example. To be specific, the spin diffusion portions 30 to 34 are formed between the bonding positions of the spin injector 12 and of the spin detector 16. The spin diffusion portions 30 to 34 are formed into a shape such that spin resistance of a path in a first direction L1 from the spin injector 12 toward the spin detector 16 becomes smaller than spin resistance of a path in a second direction L2 from the spin detector 16 toward the spin injector 12, in the spin current generated in the channel part 14.

Since the spin diffusion portions 30 to 34 have the same shape here, the spin diffusion portion 30 will be described as an example. The spin diffusion portion 30 is formed such that a cross section area of the channel part 14 in a direction perpendicular to the spin current flowing from the bonding portion in contact with the spin injector 12 to the bonding portion in contact with the spin detector 16 is enlarged than the cross section areas of the channel part 14 at other positions. For example, the spin diffusion portion 30 is formed such that the cross section area of the channel part 14 is enlarged symmetrically with respect to an axis M1 of the channel part 14 in the width direction. With the symmetrical shape of the spin diffusion portion 30 in the width direction, propagation of the spin current becomes symmetrical with respect to the axial direction. Therefore, the shape can be formed to have an influence on the spin current in the width direction while making an influence on the spin current in the first direction L1 or the second direction L2 small. Further, the spin diffusion portion 30 has tip end portions 30a at which the cross section area in the direction perpendicular to the spin current is maximized. Then, the spin diffusion portion 30 is formed asymmetrically with respect to a line M2 passing through the tip end portions 30a and extending in the direction perpendicular to the spin current, as viewed from the top surface of the substrate 20. For example, the spin diffusion portion 30 has a shape with which a rate of change of the cross section area from the spin injector 12 side toward the tip end portions 30a becomes larger than the rate of change of the cross section area from the tip end portions 30a toward the spin detector 16 side. For example, both side portions of the channel part 14 are enlarged outwardly in the width direction, and the enlarged portions form a right triangle shape where the tip end portions 30a serve as apexes, as viewed from the top surface of the substrate 20. When the length of the spin diffusion portion 30 in a direction along the spin current is three times the length of a portion of the channel part 14 in the direction perpendicular to the spin current, where the spin diffusion portion is not formed, the cross section area may be formed 1.2 to 3.0 times the cross section area of the portion of the channel part 14 in the direction perpendicular to the spin current, where the spin diffusion portion is not formed. Note that the tip end portions 30a corresponds to tip end portions 31a to 34a of the spin diffusion portions 31 to 34.

The spin valve element 10 having the above configuration is operated as follows. Here, a voltage is detected by a non-local technique described below. The non-local technique is a technique of causing diffusion conduction of spin in a portion where a current does not flow, and measuring a voltage potential caused due to spin polarization, which is different from a local technique of measuring a voltage locally caused in a portion where a current flows.

First, as illustrated in FIG. 1, a current is applied between the terminal portion 12a of the spin injector 12 and the terminal portion 14a of the channel part 14 (the outlined arrow in FIG. 1). Accordingly, the spin not parallel to the magnetization direction of the spin injector 12 is injected into the channel part 14. The spin injected into the channel part 14 is propagated to the both end portions of the channel part 14. That is, the spin is propagated in the first direction L1 between the spin injector 12 and the spin detector 16. At this time, the spin not parallel to the spin being propagated in the first direction L1 is propagated in a direction (the second direction L2) of canceling the spin being propagated in the first direction L1. That is, as illustrated in FIG. 1, for example, when upward spin is propagated in the first direction L1, downward spin flows in the second direction L2. Therefore, the flow of charges does not exists between the spin injector 12 and the spin detector 16, but the spin current in the first direction L1 and the spin current in the second direction are caused. In other words, the spin current without accompanying the flow of charges is caused between the spin injector 12 and the spin detector 16.

Here, a spin current caused in a channel part in a conventional spin valve element will be briefly described for comparison. In the conventional spin valve element, the spin current in a first direction L1 and the spin current in a second direction L2 flow at the same propagation speed, and the both spin currents are exponentially decreased according to the distance of the propagation of the spin. Movement of upward spin in a reverse direction can be regarded as movement of downward spin in a forward direction. Therefore, even a total spin current expressed by a difference between the spin current in the first direction L1 and the spin current in the second direction L2 is exponentially decreased according to the distance of propagation.

In contrast, the spin propagated in the channel part 14 is not only propagated in the first direction and the second direction, but also is diffused in the width direction with the spin diffusion portion 30. The shape of the spin diffusion portion 30 is formed such that the degree of diffusion of the spin current in the first direction L1 and the degree of diffusion of the spin current in the second direction L2 are different. Here, the degree of diffusion of the spin current in the first direction L1 is larger than the degree of diffusion of the spin current in the second direction L2. That is, the spin resistance in the first direction L1 is smaller than the spin resistance in the second direction L2. Therefore, the spin current in the second direction L2 is less easily propagated than a case of not providing the spin diffusion portion 30, while the spin current in the first direction is more easily propagated than the case of not providing the spin diffusion portion 30. That is, the attenuation of the spin current in the first direction is suppressed. Therefore, in the spin valve element 10 according to the present embodiment, although the spin current in the first direction L1 and the spin current in the second direction L2 are exponentially decreased according to the distance of the propagation of the spin, the attenuation of the spin current in the first direction L1 is suppressed, and thus the spin diffusion length of the spin current in the first direction L1 is relatively longer than that in the second direction L2. Therefore, as a total spin current, the attenuation is suppressed, and as a result, the spin current is increased.

As described above, according to the spin valve element 10 according to the present embodiment, the spin diffusion portion 30 with the enlarged cross section area in the direction perpendicular to the spin current is formed in a part of the channel part 14, and the shape of the spin diffusion portion 30 is formed such that the spin current in the first direction L1 from the spin injector 12 toward the spin detector 16 more easily flow than the spin current in the second direction L2 from the spin detector 16 toward the spin injector 12. Therefore, the attenuation of the spin current in the first direction L1 can be suppressed. Therefore, the attenuation of the spin current of the entire channel part 14 is suppressed. As a result, the spin current can be increased. Therefore, the space between the spin injector and the spin detector can be enlarged, and thus the degree of freedom of design is improved. Further, the spin diffusion length is controlled with the shape, instead of the material of the channel part, and thus element design can be performed regardless of the material. Further, the spin valve element 10 can be manufactured by performing of laminating/etching on the substrate 20. Therefore, the spin valve element 10 can be easily manufactured by a conventional semiconductor technology.

The above-described embodiment is an example of the spin valve element according to the present invention. The spin valve element according to the present invention is not limited to the spin valve element 10 according to the present embodiment, and may be modified, or may be applied to other embodiments.

For example, in the above-described embodiment, as the shape of the spin diffusion portion 30, an example in which the both side portions of the channel part 14 are enlarged outwardly in the width direction and the enlarged portions form right triangle shapes (ratchet shapes) where the tip end portions 30a serve as the apexes, as viewed from the top surface of the substrate 20, has been described. However, other shape may be employed as long as the shape is asymmetrical with respect to the line M2 passing through the tip end portions 30a. For example, an acute angled triangle or an obtuse angled triangle may be employed (see FIG. 3(A)). Further, a three-dimensionally asymmetrical shape may be employed, as well as the shape in the in-plane direction.

Figure 3:
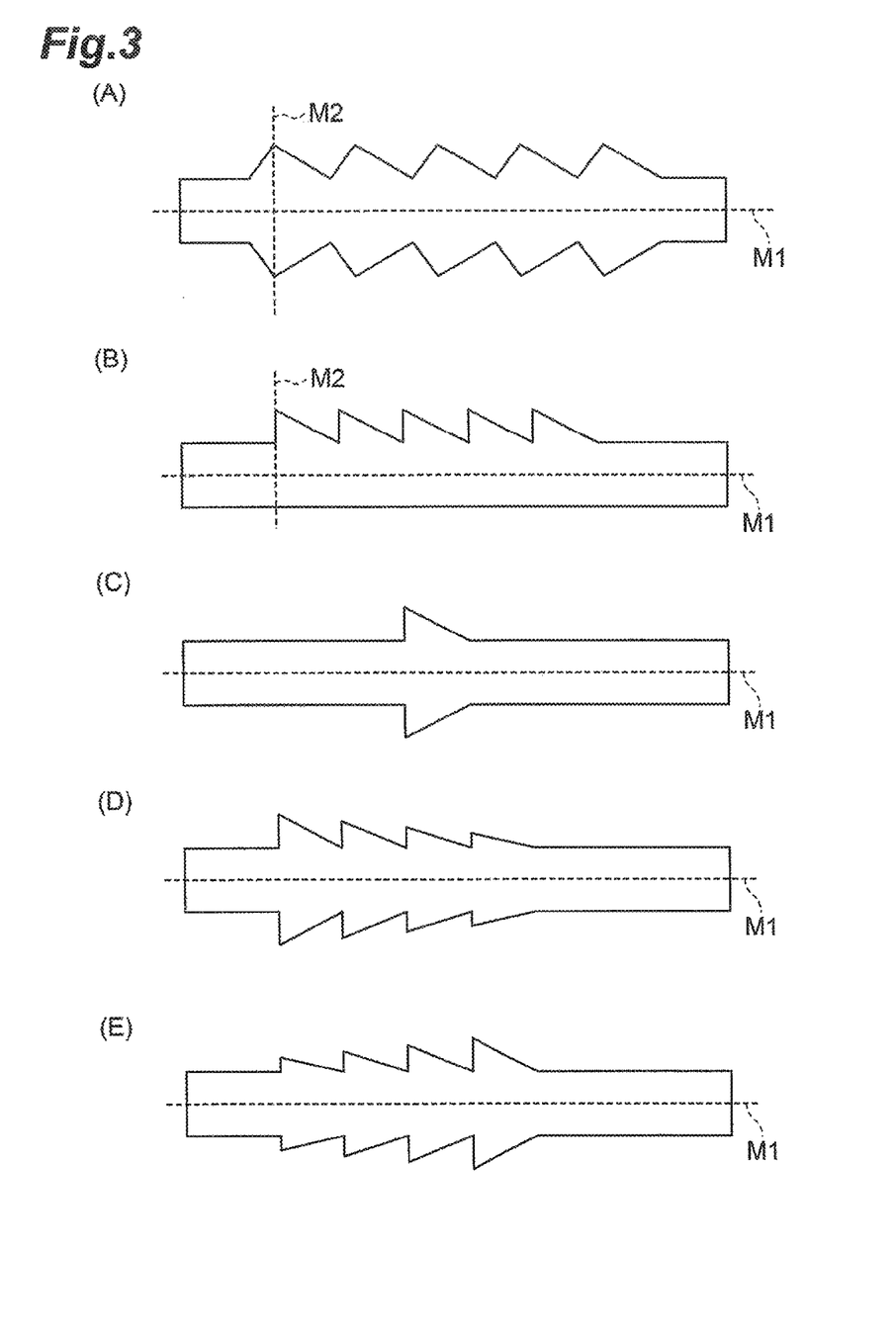
FIGS. 3(A) to 3(E) are schematic views illustrating modifications of spin diffusion portions.
Figure 4:
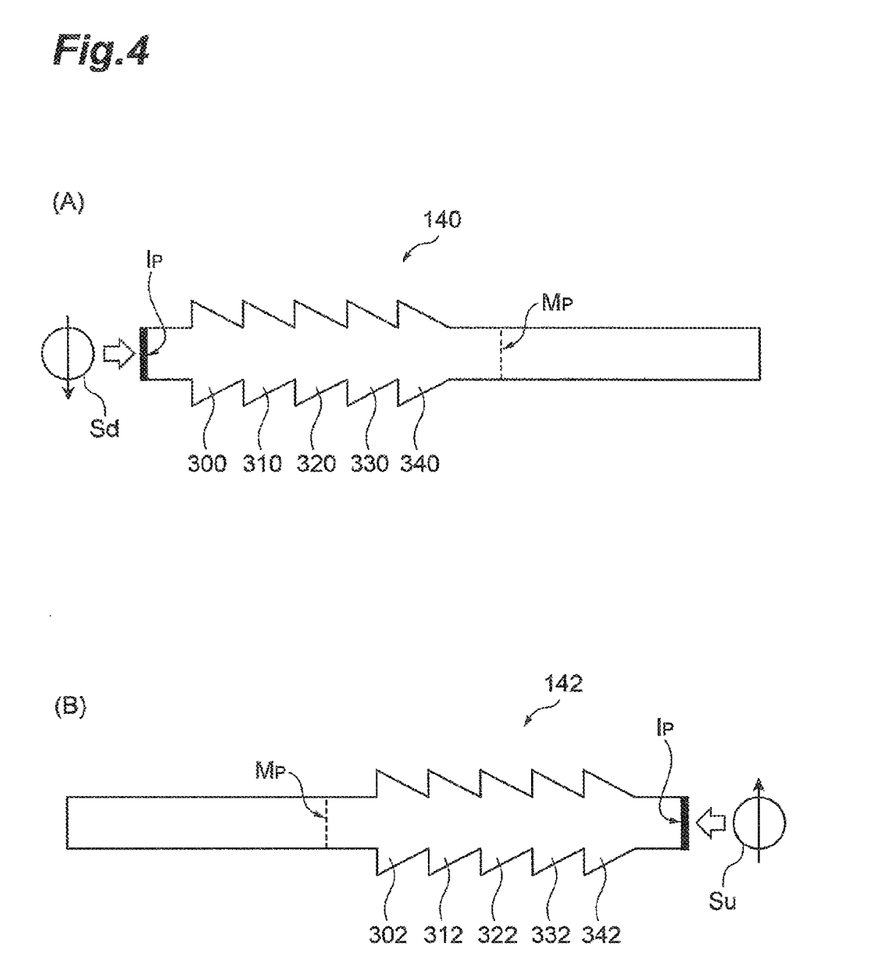
FIGS. 4(A) and 4(B) are schematic diagrams illustrating a relationship between a spin valve element and a spin to be injected in a simulation.

Further, in the above-described embodiment, as the shape of the spin diffusion portion 30, an example in which the shape is symmetrical with respect to the axis of the channel part 14 has been described. However, the shape may be asymmetrical with respect to the axis of the channel part 14. For example, as illustrated in FIG. 3(B), only one of the side portions of the channel part 14 may be enlarged outwardly in the width direction.

Further, in the above-described embodiment, an example in which the spin diffusion portions 30 to 34 configure one spin diffusion portion. However, as illustrated in FIG. 3(C), only the spin diffusion portion 30 may be included, or a plurality of spin diffusion portions 30 other than five may be included. The channel part 14 may include one or more spin diffusion portions 30 at one of the both side portions.

Further, in the above-described embodiment, an example in which the spin diffusion portions 30 to 34 have the same shape has been described. However, the spin diffusion portions 30 to 34 may have different shapes, as illustrated in FIGS. 3(D) and 3(E). For example, as illustrated in FIG. 3(D), the spin diffusion portions 30 to 34 may have a characteristic that the triangles having the tip end portions 30a as the apexes tend to become smaller, as viewed from the top surface of the substrate 20. Further, for example, as illustrated in FIG. 3(E), the spin diffusion portions 30 to 34 may have a characteristic that the triangles having the tip end portions 30a as the apexes tend to become larger, as viewed from the top surface of the substrate 20.

Further, the size of each configuration members of the spin valve element 10 is not especially limited, and may be a micrometer-order, or may be nanometer-order.

Further, in the above-described embodiment, an example of the spin valve element 10 having an in-plane spin valve structure has been described. However, the spin injector and the spin detector may have a structure in which the spin injector and the spin detector sandwich the channel part in the laminating direction.

EXAMPLE

Hereinafter, Examples and Modifications conducted by the inventor will be described with reference to FIGS. 4(A) and 4(B) to 7(a) to 7(e) to describe the above effect.

Confirmation of Attenuation Suppression Effect

Example 1

Figure 5:
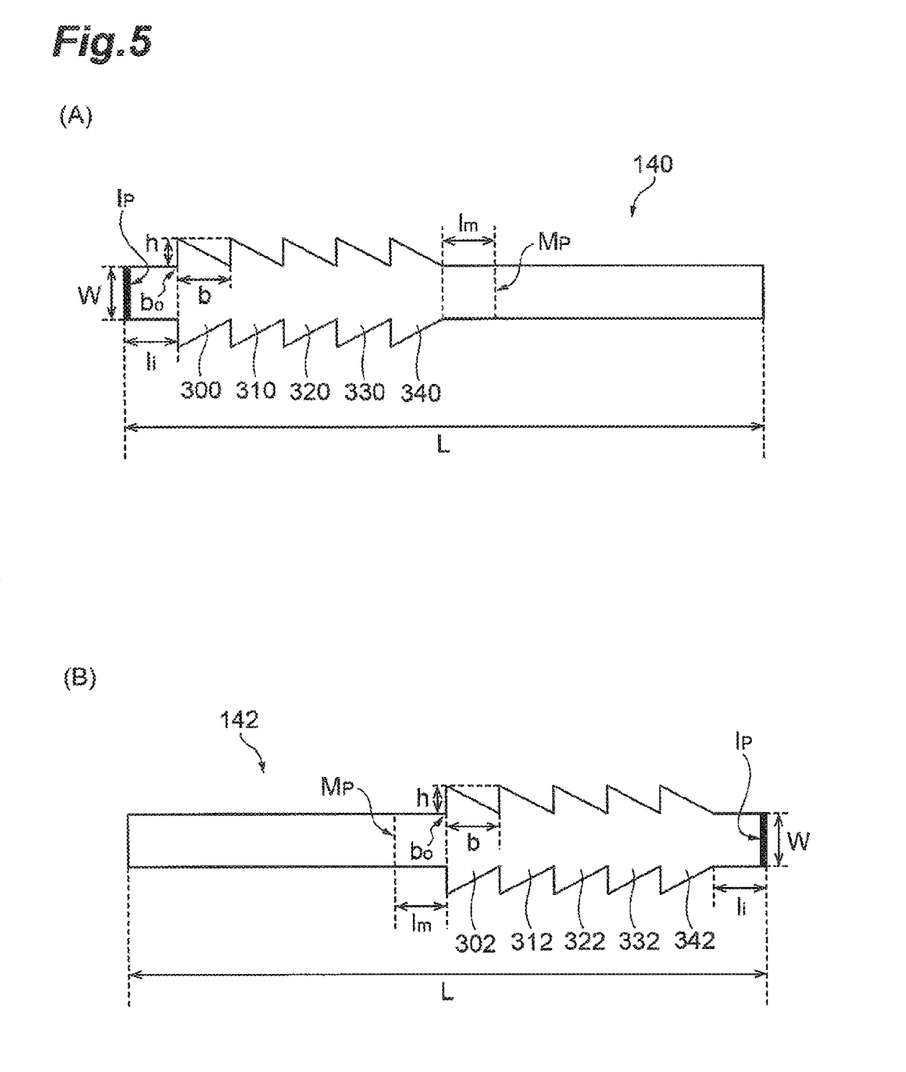
FIGS. 5(A) and 5(B) are schematic diagrams illustrating a model used in a simulation.
Figure 6:
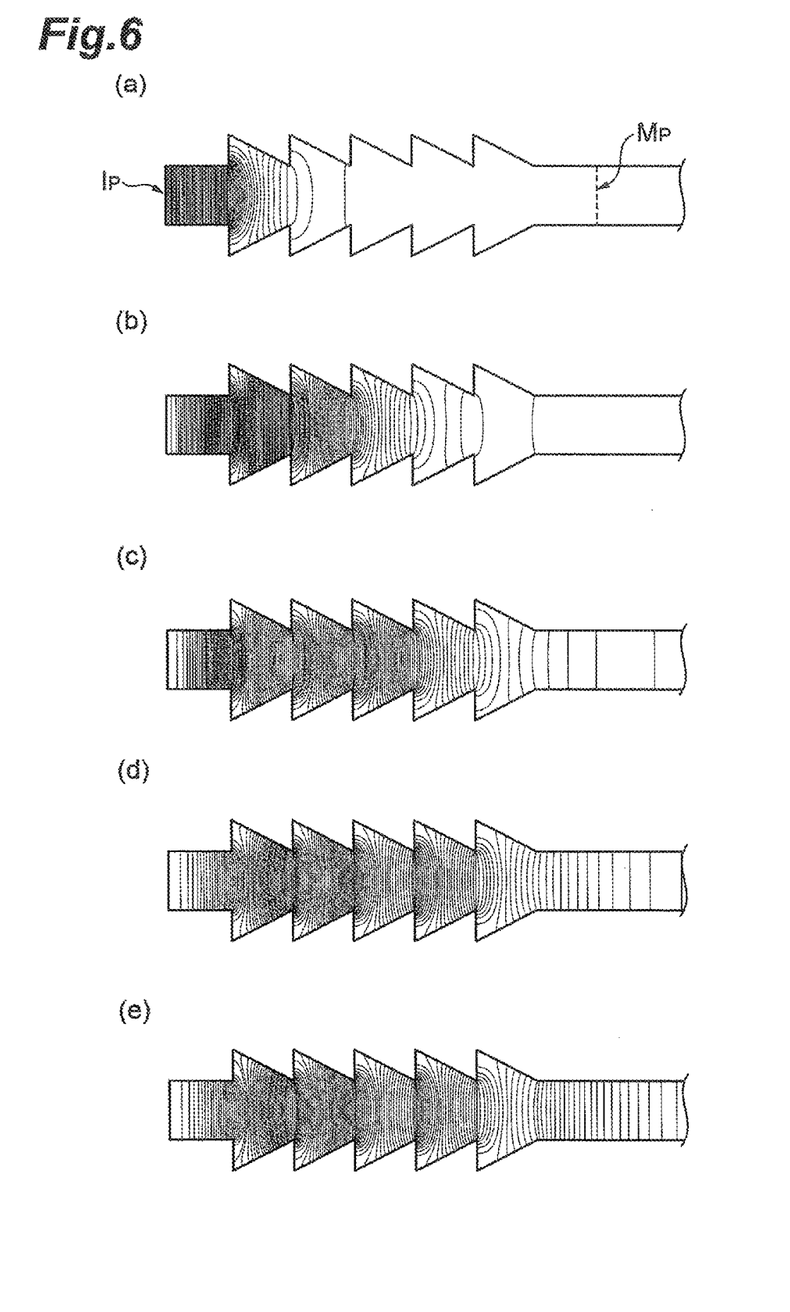
Figure 7:
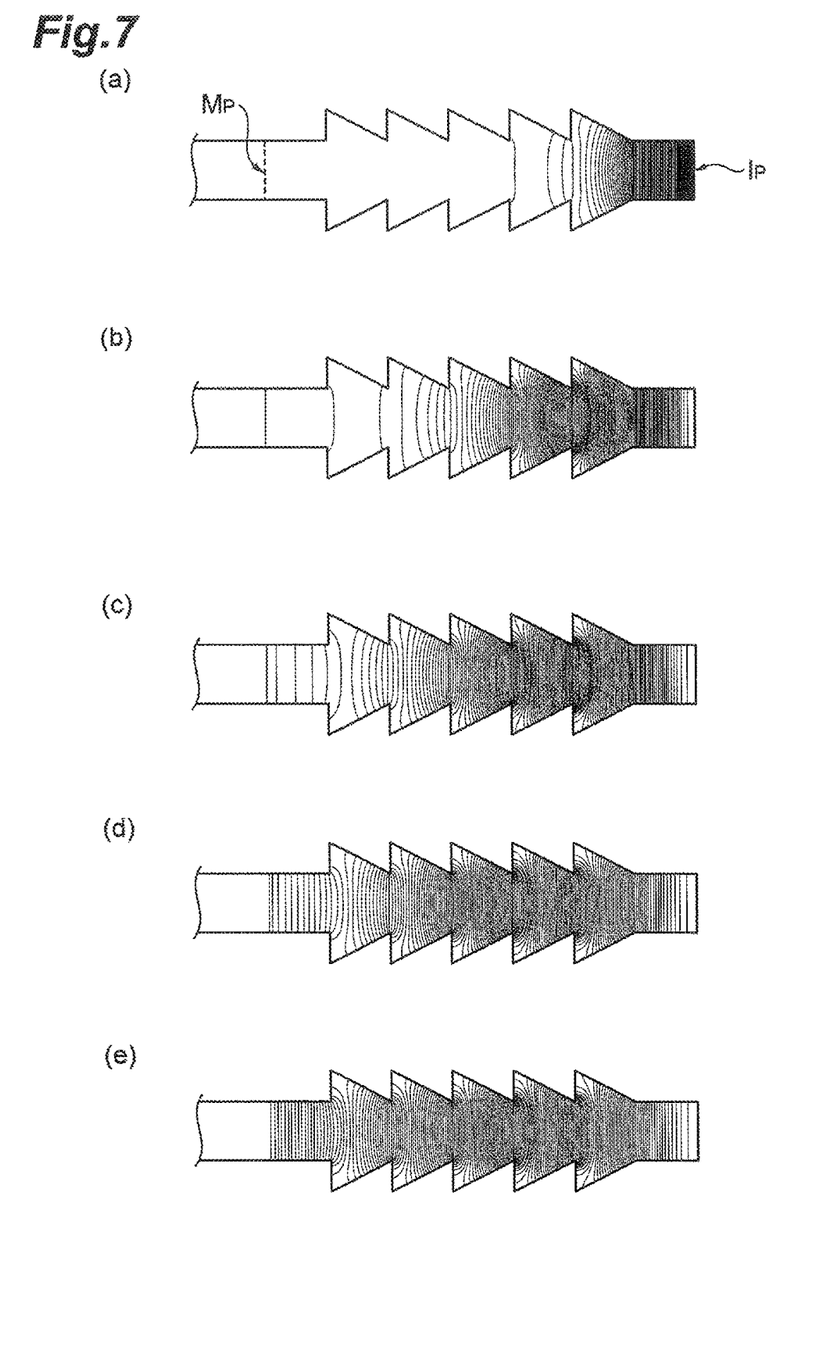

First, a simulation was conducted using a model 140 illustrated in FIGS. 4(A) and 5(A). The Channel part 14 of the spin valve element 10 was numerically reproduced with the model 140, and the diffusion of the injected spin was calculated by a finite element method. Note that, in the simulation, the diffusion of the spin was replaced with diffusion of electrons, and the current density was calculated.

One end Ip of the model 140 is an application point, and a downward spin Sd was injected from the application point Ip. The model 140 is a model that simulates the spin current of the downward spin Sd generated from the left to right in the drawing. A length L in a longitudinal axial direction was 2,500 nm, a width W in a direction perpendicular to the longitudinal axial direction was 100 nm, and the thickness was 1 nm. A distance li from the application point Ip to a point where the spin diffusion portion 300 is formed was 100 nm. A width b of each of the spin diffusion portions 300 to 340 was 100 nm, and a height h was 50 nm. A distance lm from an end point b0 of the spin diffusion portion at the spin detector side, the spin diffusion portion being most distant from the application point Ip, to a measurement point Mp was 50 nm. Further, Cu was assumed as the material, and a relaxation time constant τ of the spin was 12 ps.

In the model 140, the downward spin Sd was injected from the application point Ip. A result is illustrated in FIGS. 6(a) to 6(e). In FIGS. 6(a) to 6(e), change of the spin current is illustrated in time series from FIGS. 6(a) to 6(e). As can be seen from FIGS. 6(a) to 6(e), it has been confirmed that the downward spin Sd is propagated from the left to right in the drawing with the lapse of time, and is diffused in the spin diffusion portions in the width direction. Then, the number of the downward spins Sd was calculated at the measurement point Mp, and the current density was obtained.

Next, a simulation was conducted using a model 142 illustrated in FIGS. 4(B) and 5(B). The model 142 is a model for simulating the spin current of an upward spin Su generated from the right to left in the drawing, and is different from the model 140 in that the application point Ip and the measurement point Mp are opposite. Note that forming positions of the spin diffusion portions of the model 140 and of the spin diffusion portions of the model 142 are different. However, this is because a noise due to occurrence of reflection of the spin current in the path at the measurement point Mp and subsequent points is eliminated, and the difference is not a substantial difference. A structure in which the application point Ip and the measurement point Mp of the spin are arranged at sides opposite to the channel part 14 of the spin valve element 10 was numerically reproduced using the model 142.

In the model 142, the upward spin Su was injected from the application point Ip. A result is illustrated in FIGS. 7(a) to 7(e). In FIGS. 7(a) to 7(e), change of the spin current was illustrated in time series from FIGS. 7(a) to 7(e). As illustrated in FIGS. 7(a) to 7(e), it has been confirmed that the upward spin Su is propagated from the right to left in the drawing with the lapse of time, and is diffused in the spin diffusion portions in the width direction. Further, it has been confirmed that the degree of diffusion is different from the case of the simulation with the model 140. That is, it has been confirmed that the degrees of diffusion of the spin current from the spin injector toward the spin detector and of the spin current from the spin detector toward the spin injector can be changed with the spin diffusion portions described in the above embodiment. Then, the number of the upward spins Su was calculated at the measurement point Mp, and the current density was obtained.

Comparative Example 1

A simulation that is the same as Example, other than a point that the height h is 0, was conducted.

The simulation result of Example 1 and a simulation result of Comparative Example 1 were obtained. Evaluation was values of the current density from differences between the numbers of upward spins and the numbers of downward spins measured at the measurement point Mp. The results are illustrated in FIG. 8.

Figure 8:
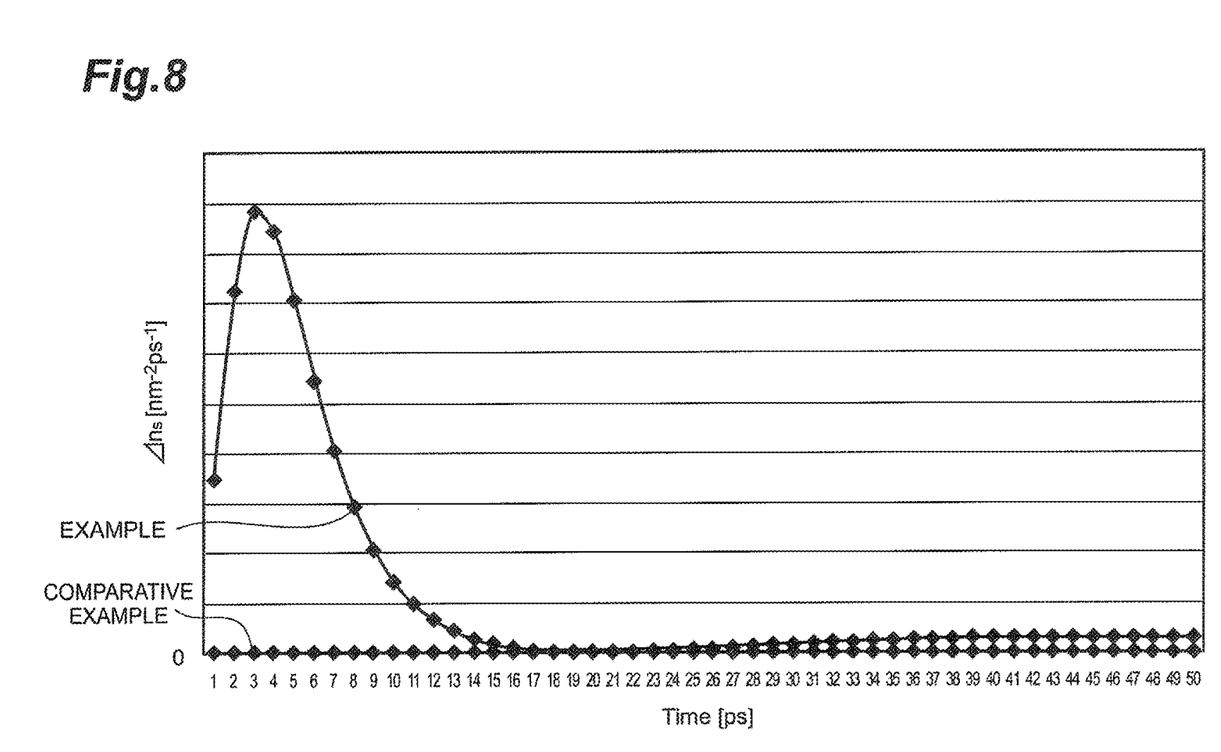
FIG. 8 is a graph illustrating a simulation result of current density of a spin current.

FIG. 8 illustrates the simulation result of Example 1. FIG. 8 illustrates temporal change of the current density of the Example 1 and Comparative Example 1. The vertical axis of FIG. 8 represents the difference of the current density obtained by subtracting the number of the upward spins Su from the number of the downward spins Sd. The horizontal axis of FIG. 8 represents the lapse of time in the simulation.

As illustrated in FIG. 8, the difference of the current density of Example 1 indicated finite values. That is, it has been confirmed that a difference is caused between the propagation of the spin current from the spin injector toward the spin detector and the propagation of the spin current from the spin detector toward the spin injector. Further, the difference of the current density of Comparative Example 1 was 0. From this fact, it has been confirmed that the attenuation of the spin current can be suppressed by control of the shape of the diffusion portion.

Verification of Optimum Value of Diffusion Portion

Example 2

A simulation that is the same as Example 1 other than points that the width b is 300 nm, and the height h is 10 nm, 20 nm, 30 nm, 40 nm, 50 nm, 60 nm, 70 nm, 75 nm, 80 nm, 90 nm, and 100 nm was conducted.

With the simulation, simulation results of Example 2 were obtained. Evaluation was values of the current density from the differences between the numbers of the upward spins and of the downward spins measured at the measurement point Mp. The results are illustrated in FIG. 9.

Figure 9:
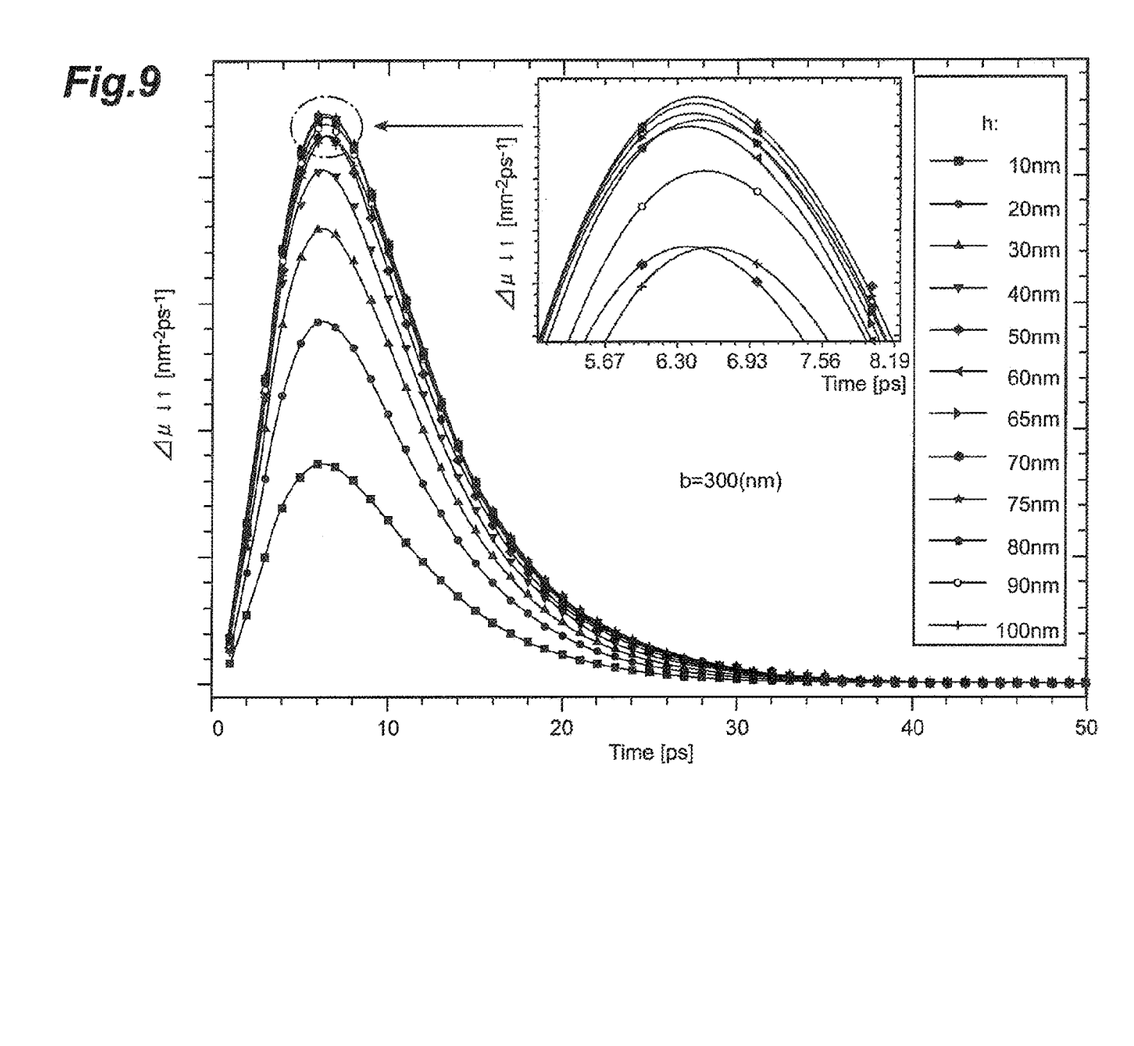
FIG. 9 is a graph of a simulation result indicating a relationship between the size of a tip end portion of a spin diffusion portion and change of current density of a spin current.

FIG. 9 illustrates the simulation result of Example 2. FIG. 9 illustrates temporal change of the current density of Example 2. The vertical axis of FIG. 9 represents the difference of the current density obtained by subtracting the number of the upward spins Su from the number of the downward spins Sd. The horizontal axis of FIG. 9 represents the lapse of time in the simulation. Further, the inserted diagram of FIG. 9 is an enlarged diagram of a point where the time is around 6.30 ps.

As illustrated in FIG. 9, the difference of the current density of each height h in Example 2 indicates finite values. Therefore, when the width b is three times the width W, the cross section area of the spin diffusion portion may be formed 1.2 to 3.0 times the cross section area of a portion of the channel part in the direction perpendicular to the spin current, where the spin diffusion portion is not formed. That is, in the case where the spin diffusion portion has a right triangle shape where the tip end portions server as the apexes, as viewed from the top surface of the channel part, when the length of one side that is parallel to the right triangular shaped channel part is three times the length of the channel part in the direction perpendicular to the spin current, it has been confirmed that the spin diffusion portion may be enlarged such that the cross section area of the spin diffusion portion becomes 1.2 to 3.0 times.

Example 3

A simulation that is the same as Example 1, other than points that the width b is 100 nm, 150 nm, 200 nm, 250 nm, 300 nm, 350 nm, 400 nm, and 450 nm, and the height h is 50 nm, 60 nm, 70 nm, 75 nm, and 80 nm, was conducted.

With the simulation, simulation results of Example 3 were obtained. Evaluation was values of the current density from the differences between the numbers of the upward spins and of the downward spins measured at the measurement point Mp. The results are illustrated in FIG. 10.

Figure 10:
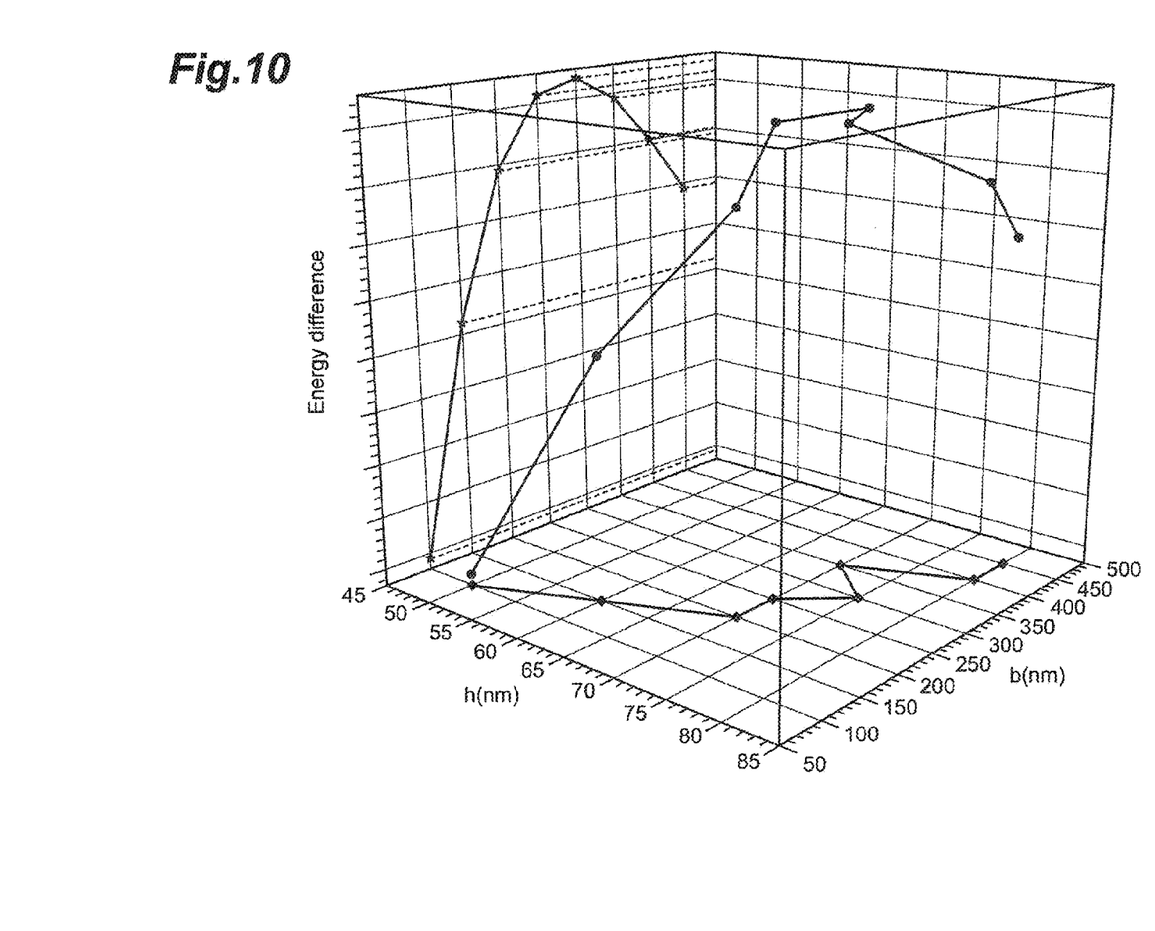
FIG. 10 is a graph of a simulation result illustrating a relationship between the size of a cross section area of a spin diffusion portion and change of current density of a spin current.

FIG. 10 illustrates the simulation results of Example 3. With regard to axes of FIG. 10, an axis b represents the width of the spin diffusion portion, an axis h represents the height of the spin diffusion portion, and an axis Energy difference represents the difference of the current density obtained by subtracting the number of the upward spins Su from the number of the downward spins Sd.

FIG. 10 illustrates a combination of the height h and the width b with which the difference of the current density is maximized in the heights h and the widths b. Further, FIG. 10 illustrates the value of the difference of the current density. From this, it has been confirmed that, when the height of the spin diffusion portion and the length of the bottom side are changed, the enlarged portion of the spin exists in the channel part, and thus the significant difference is caused in the flow of the upward spin and the downward spin.

INDUSTRIAL APPLICABILITY

The spin valve element 10 has industrial applicability as follows. For example, the spin valve element 10 can be used as a resistance element in a nanoscale circuit in the field of micro electro mechanical systems (MEMS), nano electro mechanical systems (NEMS), and the like. Further, the spin valve element 10 can be used as a device component or an element of the electrical and/or electronic field, the medical related field, and the like.

REFERENCE SIGNS LIST

10 . . . Spin valve element, 12 . . . Spin injector, 12*a* . . . Terminal portion, 14 . . . Channel part, 14*a* . . . Terminal portion, 16 . . . Spin detector, 20 . . . Substrate, 30, 31, 32, 33, and 34 . . . Spin diffusion portion, 30*a*, 31*a*, 32*a*, 33*a*, and 34*a* . . . Tip end portion, 140 and 142 . . . Model, 300, 310, 320, 330, 340, 302, 312, 322, 332, 342 . . . Spin diffusion portion, Su . . . Upward spin, Sd . . . Downward spin.

The invention claimed is:

1. A spin valve element comprising:

a substrate;

a spin injector made of a ferromagnetic material;

a spin detector made of a ferromagnetic material; and a channel part made of a non-magnetic material, wherein the spin injector, the spin detector, and the channel part are formed on the substrate, the spin detector is arranged at a position separated from the spin injector in a direction parallel to a principal plane of the substrate, and are bonded to the channel part, the channel part is a linear member along a length dimension, is connected with the spin injector and the spin detector directly or through an insulating layer, and includes spin diffusion portions formed between bonding positions of the spin injector and of the spin detector, each spin diffusion portion extends outwardly in a width direction and is shaped asymmetrically with respect to a latitudinal axis as viewed from above.

2. The spin valve element according to claim 1, wherein a rate of change of the cross section area of the channel part containing the spin diffusion portions varies along an axis of the channel part.

3. The spin valve element according to claim 1, wherein the spin diffusion portions extend outwardly from both sides of the channel part and are symmetrically opposed with respect to an axis of the channel part, as viewed from above.

4. The spin valve element according to claim 1, wherein each spin diffusion portion has a triangular shape as viewed from above.

5. The spin valve element according to claim 4, wherein the triangular shape is a right triangle shape.

6. The spin valve element according to claim 1, wherein each spin diffusion portion has a pointed tip end portion as viewed from above.

7. The spin valve element according to claim 1, wherein each spin diffusion portion has only one pointed tip as viewed from above.

8. The spin valve element according to claim 1, wherein the length of each spin diffusion portion is greater than the width of each portion of the channel part that has no spin diffusion portions.

9. The spin valve element according to claim 1, wherein the length of each spin diffusion portion is three times greater than the width of each portion of the channel part that has no spin diffusion portions.

10. The spin valve element according to claim 7, wherein for each spin diffusion portion, a rate of change of the cross section area from a base of a spin diffusion portion nearer to the spin injector to the only one pointed tip is larger than a rate of change of the cross section area from the only one pointed tip to a base of a spin diffusion portion nearer to the spin detector.

* * * * *